United States Patent
Winkelnkemper et al.

(10) Patent No.: US 8,559,479 B2
(45) Date of Patent: Oct. 15, 2013

(54) PHOTON PAIR SOURCE AND METHOD FOR ITS PRODUCTION

(75) Inventors: Momme Winkelnkemper, Berlin (DE); Andrei Schliwa, Storkow (DE); Dieter Bimberg, Berlin (DE)

(73) Assignee: Technische Universitat Berlin, Berlin (DE)

( * ) Notice: Subject to any disclaimer, the term of this patent is extended or adjusted under 35 U.S.C. 154(b) by 0 days.

(21) Appl. No.: 13/056,967

(22) PCT Filed: Jul. 20, 2009

(86) PCT No.: PCT/DE2009/001025
§ 371 (c)(1),
(2), (4) Date: Jan. 31, 2011

(87) PCT Pub. No.: WO2010/012268
PCT Pub. Date: Feb. 4, 2010

(65) Prior Publication Data
US 2011/0142088 A1   Jun. 16, 2011

(30) Foreign Application Priority Data
Aug. 1, 2008   (DE) .................. 10 2008 036 400

(51) Int. Cl.
*H01S 3/06*   (2006.01)

(52) U.S. Cl.
USPC .............................. 372/66; 977/774; 977/951

(58) Field of Classification Search
USPC .................. 372/43.01, 66; 977/774, 951
See application file for complete search history.

(56) References Cited

U.S. PATENT DOCUMENTS

2005/0054172 A1*  3/2005  Feng et al. ............. 438/313
2010/0074293 A1   3/2010  Lochmann et al.

FOREIGN PATENT DOCUMENTS

| JP | 2005-136267 | 5/2005 |
| JP | 2006-267888 | 10/2006 |
| WO | WO-2007/062625 A2 | 7/2007 |

OTHER PUBLICATIONS

Gallo, "Integration of site-controlled pyramidal quantum dots and photonic crystal membrane cavities," Applied Physics Letters, vol. 92, No. 26, Jun. 30, 2008, pp. 263101-263101.*
Benson, O. et al. "Regulated and Entagled Photons from a Single Quantum Dot", Physical Review Letters, Mar. 13, 2000, vol. 84, No. 11, pp. 2513-2516.
Bimberg, D. et al. —Quantum Dot Heterostructures (Table of Contents only).
Bimberg, D. et al. "Quantum Dots for Single-and Entangled-Photon Emitters", IEEE Photonics Journal, Jun. 2009, vol. 1, No. 1, pp. 58-68.
Clauser, J. et al. "Proposed Experiment to Test Local Hidden-Variable Theories", Physical Review Letters, Oct. 13, 1969, vol. 23, No. 15, pp. 880-884.

(Continued)

*Primary Examiner* — Jessica Stultz
*Assistant Examiner* — Marcia Golub-Miller
(74) *Attorney, Agent, or Firm* — Foley & Lardner LLP

(57) ABSTRACT

The invention relates to a method for the production of a photon pair source, which generates entangled photon pairs, having at least one quantum dot, wherein in the method the operational behaviour of the photon pair source is determined by adjusting the fine structure splitting of the excitonic energy level of the at least one quantum dot. It is provided according to the invention for the fine structure splitting of the excitonic energy level to be adjusted by depositing the at least one quantum dot on a {111} crystal surface of a semiconductor substrate.

20 Claims, 6 Drawing Sheets

(56) References Cited

OTHER PUBLICATIONS

Ekert, A. et al. "Practical Quantum Cryptography Based on Two-Photon Interferometry", Physical Review Letters, Aug. 31, 1992, vol. 69, No. 9, pp. 1293-1295.

Gallo, P. et al. "Integration of site-controlled phyramidal quantum dots and photonic crystal membrane cavities", Applied Physics Letters, 2008, vol. 92, pp. 263101-1 to 263101-3.

International Preliminary Report on Patentability (IPRP) in PCT/DE2009/001025 dated Mar. 15, 2011.

International Search Report in PCT/DE2009/001025 dated Mar. 3, 2010.

Kapon, E. "Ordered Pyramidal Quantum Dots for Quantum Photonics Applications", Quantum Photonics, Feb. 2006.

Knill, E. et al. "A scheme for efficient quantum computation with linear optics", Nature, Jan. 4, 2001, vol. 409, pp. 46-52.

Lobo, C. et al. "InGaAs island shapes and adatom migration behavior on (100), (110), (111), and (311) GaAs surfaces", Journal of Applied Physics, Apr. 15, 1998, vol. 83, No. 8, pp. 4168-4172.

Mohan, A. et al. "Entangled photons produced with high-symmetry site-controlled quantum dots", Indium Phosphide & Related Materials, 2009, pp. 410-411.

Rastelli, A. et al. "In situ laser microprocessing of single self-assembled quantum dots and optical microcavities", Applied Physics Letters, 2007, vol. 90, pp. 073120-1 to 073120-3.

Santori, C. et al. "Polarization-correlated photon pairs from a single quantum dot", Physical Review B, 2002, vol. 66, pp. 045308-1 to 045308-4.

Seguin, R. et al. "Size-Dependent Fine-Structure Splitting in Self-Organized InAs/GaAs Quantum Dots", Physical Review Letters, Dec. 16, 2005, vol. 95, pp. 257402-1 to 257402-4.

Shields, A. "Quantum Logic with Light, Glass, and Mirrors", Science, 2002, vol. 297, pp. 1821-1822.

Stevenson, R. et al. "A semiconductor source of triggered entangled photon pairs", Nature, Jan. 2006, vol. 439, pp. 179-182.

Sugiyama, Y. et al. "Novel InGaAs/GaAs quantum dot structures formed in tetrahedral-shaped recesses on (111)B GaAs substrate using metalorganic vapor phase epitaxy", Appl. Phys. Lett., Jul. 10, 1995, vol. 67, No. 2, pp. 256-258.

Tittel, W. et al. "Quantum Cryptography Using Entangled Photons in Energy-Tim Bell States", Physical Review Letters, May 15, 2000, vol. 84, No. 20, pp. 4737-4740.

P. Galio et al., "Integration of site-controlled pyramidal quantum dots and photonic crystal membrane cavities", Applied Physics Letters, 92, 263101-1-263101-3, 2008.

\* cited by examiner

PHOTON PAIR SOURCE AND METHOD FOR ITS PRODUCTION

The invention relates to a method comprising the features in accordance with the preamble of claim 1.

A method of this type is known from the international patent application WO 2007/062625 A2. This previously known method involves producing a photon pair source, which generates entangled photon pairs, by one or more quantum dots being deposited on a substrate. In order to have the effect that the photon pair source can generate entangled photon pairs, the fine structure splitting of the excitonic energy level of the quantum dot or quantum dots is set to be as small as possible. The cited document recommends providing a range of between −100 μeV and +100 μeV for the fine structure splitting, in order to enable entangled photon pairs to be generated. Such a fine structure splitting is achieved in accordance with the teaching of the document by setting a number of atoms per quantum dot to be between 800 and 5000 atoms.

The invention is based on the object of specifying a method for producing a photon pair source, which generates entangled photon pairs, which can be carried out even more simply and more reproducibly than previous methods.

This object is achieved according to the invention by means of a method comprising the features in accordance with patent claim 1. Advantageous configurations of the method according to the invention are specified in dependent claims.

Accordingly, the invention provides for the fine structure splitting of the excitonic energy level of the quantum dots to be set by the latter being deposited on a {111} crystal face of a semiconductor substrate. A {111} crystal face is understood to mean the {111}-oriented crystal face of the substrate and all other crystal faces which are equivalent to the {111}-oriented crystal face.

One essential advantage of the method according to the invention can be seen in the fact that the fine structure splitting is always zero, at least always almost zero, in this method. The inventors ascertained this substantive matter by theoretical investigations in which the excitonic states of the quantum dots were calculated by means of the so-called configuration interaction method (referred to hereinafter as CI method for short). In this case, the multi-particle Hamiltonian operator was expanded into a basis of antisymmetrized products of single-particle wave functions (Slater determinants). The single-particle states were calculated by means of so-called 8-band k p theory taking account of the real 3D geometry, the lattice distortion caused by the Stranski-Krastanow growth method, and the piezoelectric effects that are crucial here. The CI method, derived from quantum chemistry, is very exact and takes account not only of the direct Coulomb and correlation effects but also the exchange terms that occur here. By means of this method, the inventors modeled the fine structure splitting of quantum dots positioned on a (111) substrate, wherein the quantum dots themselves were assumed to be rotationally symmetrical. The vertical aspect ratio (ratio of height to width), the quantum dot size and the average proportion of indium in the quantum dot were varied. From symmetry considerations it was possible to deduce that the fine structure splitting must disappear for each quantum dot on a (111) substrate with an at least three-fold axis of symmetry perpendicular to the (111) plane. This also agrees with numerical simulations carried out by the inventors. In this case, the inventors additionally ascertained that on account of the lattice symmetry in the case of a (111) crystal surface there are no mutually orthogonal anisotropy directions for the adatom mobilities which could lead to the growth of a quantum dot elongated in a lateral direction. In the case of a "perfect" {111} surface, therefore, a C3v symmetry of the quantum dot—that is to say that the resulting quantum dot has a three-fold axis of symmetry—and hence an elimination of the fine structure splitting should always be expected. Deviations therefrom are of exclusively statistical (random) nature and can be disregarded technically.

A further essential advantage of the method according to the invention is that a piezoelectric field arising as a result of strain of the quantum dot does not manifest a symmetry-reducing effect for the quantum dot and, consequently, the C3v symmetry and hence the fine structure splitting are maintained even in the case of strain and when a piezoelectric field occurs.

A third essential advantage of the method according to the invention is based on the fact that the symmetry of the underlying crystal lattice of the semiconductor substrate is compatible with the C3v symmetry of the quantum dot and accordingly therefore cannot manifest a symmetry-reducing effect. Owing to the use of a {111} substrate face, the quantum mechanical confinement potential likewise has at least a C3v symmetry, such that the fine structure splitting must disappear and, accordingly, entangled photon pairs can be generated.

A further essential advantage of the method according to the invention can be seen in the fact that photon pair sources for a file encryption which is based on quantum mechanical principles can be produced by said method in a very simple manner. In the case of entangled photon pairs, the measurement of one photon directly influences the measurement result for the other photon of the respective photon pair, even if said other photon is far away. A potential "eavesdropper", in order to obtain information, would have to place his own measuring instrument into the transmission line and, as a result of his measurement, would thus inevitably cancel the entanglement of the photon pairs, that is to say alter the photon transmission. This in turn becomes apparent in the polarization measurements at the location of the receiver, such that eavesdropping can be noticed.

In accordance with one preferred configuration of the method it is provided that the vertical aspect ratio of the quantum dot is between 0.05 and 0.7, in particular between 0.15 and 0.5. By way of example, the ratio between the height of the quantum dot and the diameter of the quantum dot—at the bearing area on the semiconductor substrate—is set to be between 0.05 and 0.7.

The at least one quantum dot and/or the semiconductor substrate preferably consists of a mixed crystal comprising:
  In(Ga)As material incorporated into a Ga(In,Al)As crystal,
  In(Ga)P material incorporated into a Ga(In,Al)P crystal,
  In(Ga)As material incorporated into an In(Ga,Al)P crystal, and/or
  $In_xGa_{1-x}As$ material, where x is between 0.3 and 1.

The diameter of the quantum dot—at the bearing area on the semiconductor substrate—is preferably chosen to be between 5 nm and 50 nm, in particular between 10 nm and 20 nm.

The contour of the quantum dot—as viewed perpendicularly to the {111} face of the substrate—is preferably triangular, hexagonal or round.

The invention additionally relates to a photon pair source for generating entangled photon pairs comprising at least one quantum dot.

In this regard, the invention provides for the at least one quantum dot to be deposited on a {111} crystal face of a semiconductor substrate.

With regard to the advantages of the photon pair source according to the invention, reference should be made to the above explanations in connection with the method according to the invention, since the advantages of the photon pair source according to the invention substantially correspond to those of the method according to the invention.

Advantageous configurations of the photon pair source are specified in dependent claims.

The invention is explained in greater detail below on the basis of exemplary embodiments; in this case, by way of example:

Figure 1:
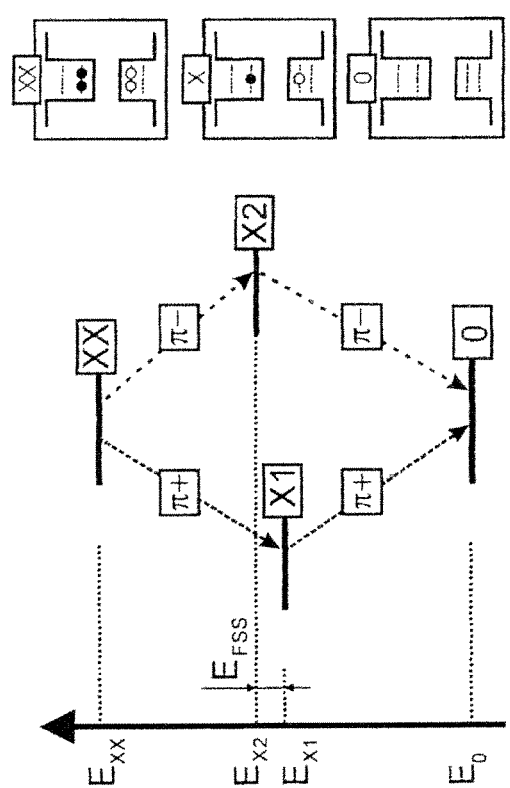
FIG. 1 shows a schematic energy diagram.

FIG. 1 illustrates, for general explanation, a schematic energy diagram for an exciton (X) and a biexciton (XX) in a quantum dot. The fine structure splitting FSS of the excitonic state is evident, which results as $E_{X1}-E_{x2}$. The two polarization directions perpendicular to one another are designated by the reference symbols π+ and π−. An emission of entangled photon pairs can be achieved if the fine structure splitting FSS is as small as possible, that is to say lies between −100 μeV and +100 μeV, for example. Photons from the biexciton→exciton→0 decay cascade are used for this purpose. An excessively large energy gap between the two excitonic states present would prevent the entanglement of the emitted photon pairs.

Figure 2:
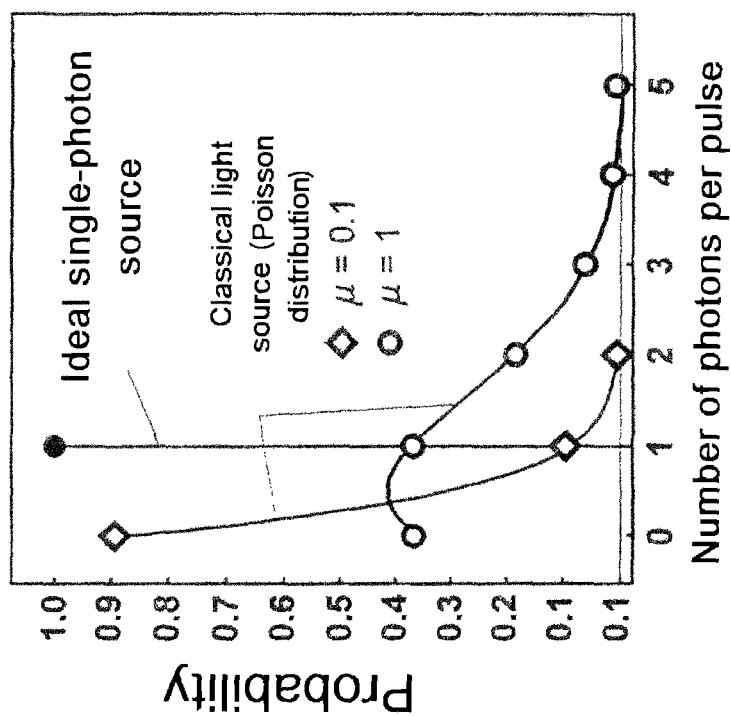
FIG. 2 shows a comparison between the photon statistics of different photon sources.

FIG. 2 shows, for general explanation, a comparison between the photon statistics of a classical photon source, which emits light quanta according to the Poisson statistics $$p(n) = \frac{\mu^n}{n!}e^{-\mu},$$

and a single-photon source such as can be realized with quantum dots, for example. p(n) indicates the probability of finding n photons in a pulse; p designates the average number of photons per pulse. These findings can be applied to photon pair sources for generating pairs of entangled photons.

Figure 3:
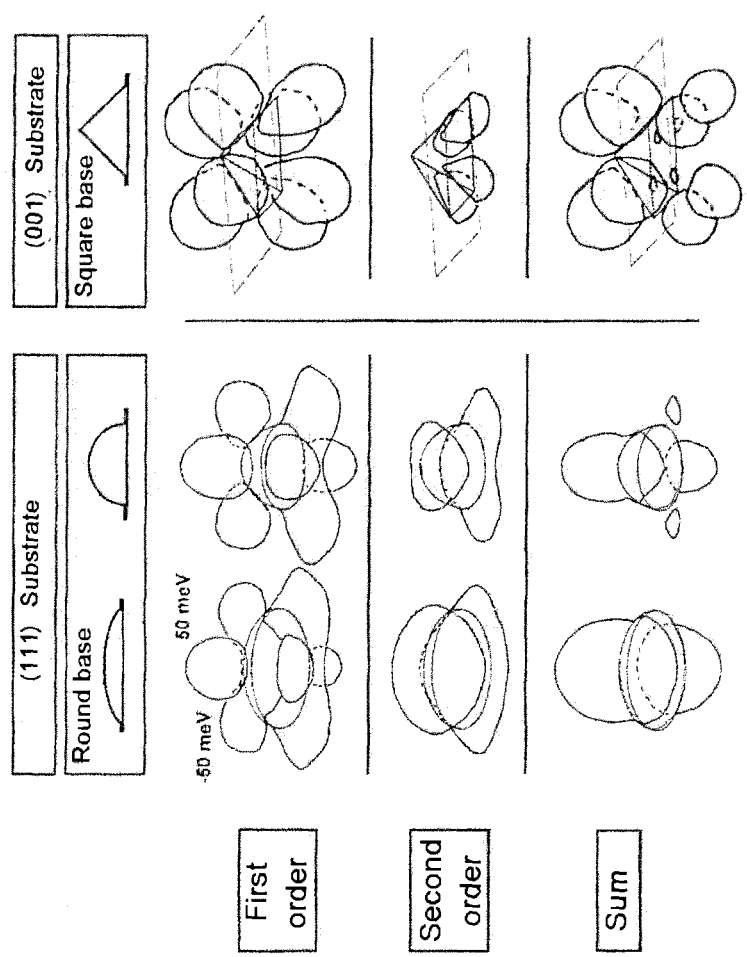
FIG. 3 shows piezoelectric fields in a comparison.

FIG. 3 shows a comparison of the piezoelectric fields (1st and 2nd orders) of quantum dots that were positioned on a (111) face (left) and on a (001) face (right). The different configuration of the piezoelectric fields is evident, which has the effect that upon growth of a quantum dot on a (111) face, the fine structure splitting is always zero, and which also has the effect that upon growth on a (001) face, a fine structure splitting of zero can be achieved only with very great difficulty.

Figure 4:
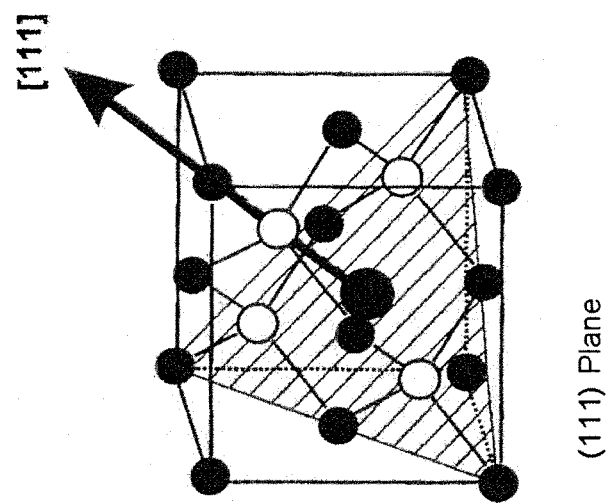
FIG. 4 shows a (001) and a (111) substrate orientation.
Figure 4:
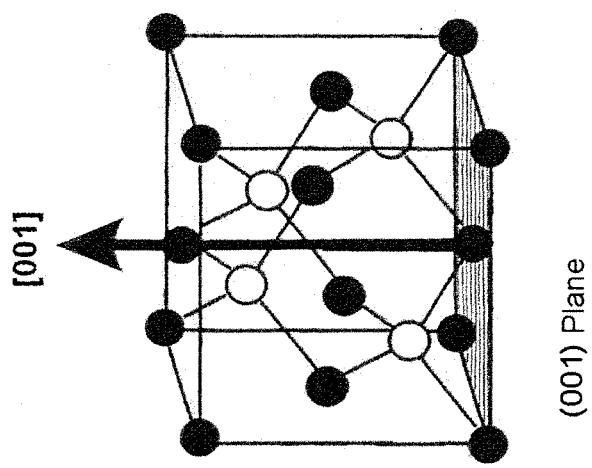

For general explanation, the (001) and (111) crystal orientations are shown once again in a three-dimensional illustration in FIG. 4.

Figure 5:
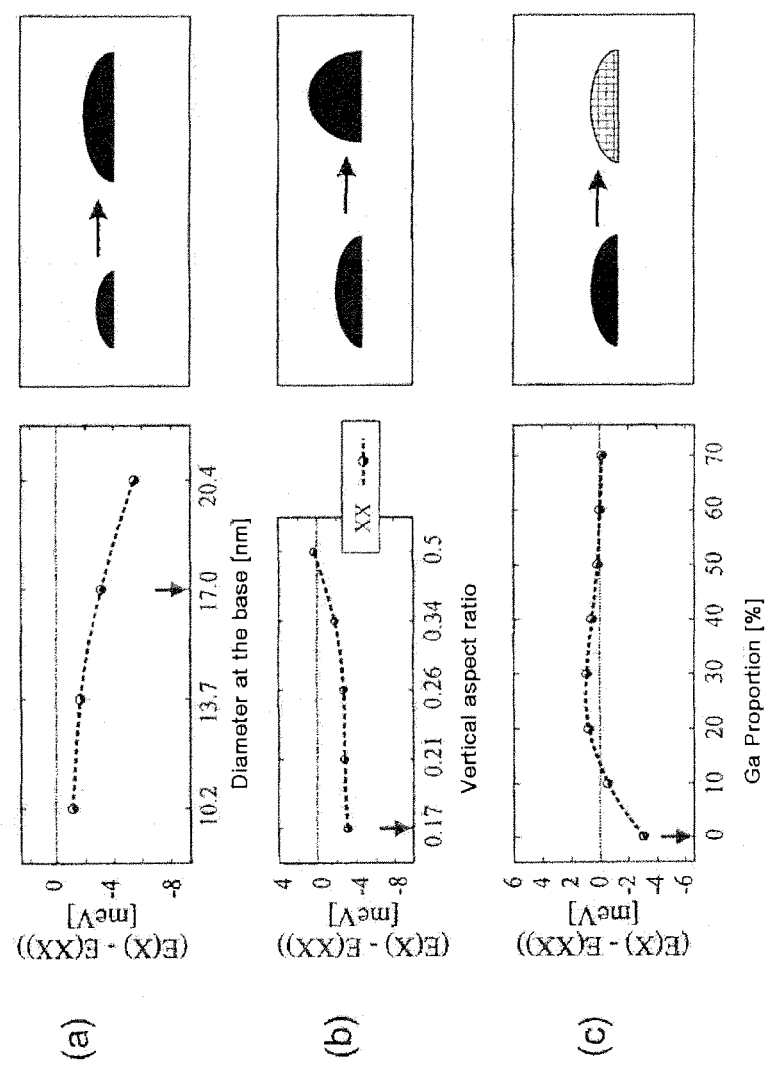
FIG. 5 shows binding energies in a comparison.

FIG. 5 shows, for exemplary embodiments of photon pair sources, the binding energies of the biexciton (dashed, curved line) relative to the exciton (set to zero, continuous line at 0 meV). It is evident that the difference between the biexciton transition energy and the exciton transition energy, that is to say the biexciton binding energy, given a constant fine structure splitting equal to zero, can be influenced by suitable parameter selection of the quantum dots. FIG. 5 shows the binding energies for the following cases:

(a) For the case of the variation of the quantum dot size, diameter from 10.2 nm to 20.4 nm. The vertical aspect ratio is 0.17.

(b) For the case of the variation of the vertical aspect ratio between 0.17 and 0.5 given a constant volume. The diameter of the flattest structure is in this case 17.0 nm, for example.

(c) For the case of the variation of the content of InAs in the quantum dot between 100% (0% GaAs) and 30% (70% GaAs). That quantum dot structure which appears in all three series jointly is respectively identified by an arrow.

The quantum dot size, the vertical aspect ratio and the chemical composition of the system are preferably used as parameters for achieving optimum properties of the photon pair sources according to the respective use requirements. The following parameters, individually or in combination, can be regarded as advantageous:

The vertical aspect ratio of the quantum dots is between 0.05 and 0.7, in particular between 0.15 and 0.5.

The ratio between the height of the quantum dots and the diameter of the quantum dots is between 0.05 and 0.7.

The diameter of the quantum dots is between 5 nm and 50 nm, in particular between 10 nm and 20 nm.

The quantum dots have a triangular, hexagonal or round contour.

The substrate and/or the quantum dots consist of a mixed crystal comprising:
In(Ga)As material incorporated into a Ga(In,Al)As crystal, and/or
In(Ga)P material incorporated into a Ga(In,Al)P crystal, and/or
In(Ga)As material incorporated into an In(Ga,Al)P crystal, and/or
$In_xGa_{1-x}As$ material, where x is between 0.3 and 1.

Figure 6:
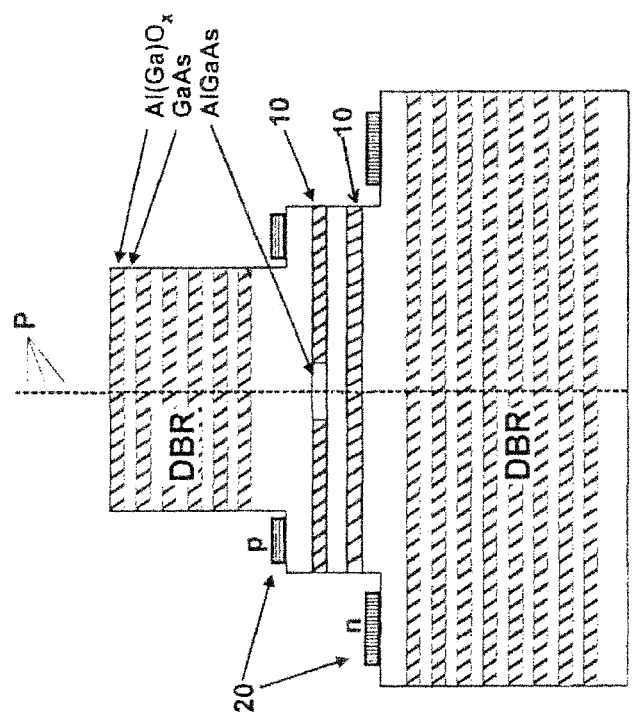
FIG. 6 shows an exemplary embodiment of a photon pair source according to the invention.

FIG. 6 shows an exemplary embodiment of a photon pair source in a three-dimensional view. It is evident how the quantum dot layer is embedded into a cavity. DBR mirrors (DBR: Distributed Bragg Reflector) are situated at the upper end and also at the lower end. The oxide aperture 10 serves for the manipulation of the current path and thus the targeted spatial selection of individual quantum dots.

The embedding into a cavity makes it possible for the photon pairs P that arise to be coupled out directionally and efficiently from the photon pair source. In a manner similar to that in the case of vertically emitting lasers, the cavity is preferably configured such that the energy of the entangled photons is in resonance with the cavity modes. On the basis of the Purcell effect, the rate of spontaneous emission is thus increased and the coupling-out efficiency is additionally increased. The metal contacts are identified by the reference sign 20.

Such a photon pair source could form for example part of a photonic network for communicating quantum-cryptographically encrypted data, e.g. by means of the Eckert protocol (A. Eckert, J. Rarity, P. Tapster, M. Palma, Phys. Rev. Lett. 69, page 1293 et seq. (1992)).

The invention claimed is:

1. A method for producing a photon pair source, which generates entangled photon pairs, comprising at least one quantum dot,
wherein, in the method, the operational behavior of the photon pair source is defined by setting the fine structure splitting of the excitonic energy level of the at least one quantum dot, wherein the fine structure splitting of the excitonic energy level is set by the at least one quantum dot being deposited on a {111} crystal face of a semiconductor substrate, wherein each of the at least one quantum dot includes at least a three-fold axis of symmetry, and wherein the fine structure splitting is zero.

2. The method as claimed in claim 1, wherein a vertical aspect ratio of the quantum dot of between 0.05 and 0.7, in particular between 0.15 and 0.5, is produced.

3. The method as claimed in claim 1, wherein the ratio between the height of the quantum dot and the diameter of the quantum dot—at the bearing area on the semiconductor substrate—is set to be between 0.05 and 0.7.

4. The method as claimed in claim 1, wherein the at least one quantum dot is produced from a mixed crystal, wherein the mixed crystal comprises In(Ga)As material incorporated into a Ga(In,Al)As crystal.

5. The method as claimed in claim 1, wherein the at least one quantum dot is produced from a mixed crystal, wherein the mixed crystal comprises In(Ga)P material incorporated into a Ga(In,Al)P crystal.

6. The method as claimed in claim 1, wherein the at least one quantum dot is produced from a mixed crystal, wherein the mixed crystal comprises In(Ga)As material incorporated into an In(Ga,Al)P crystal.

7. The method as claimed in claim 1, wherein the at least one quantum dot is produced from a mixed crystal comprising $In_xGa_{1-x}As$ material, where x is between 0.3 and 1.

8. The method as claimed in claim 1, wherein the quantum dot is produced with a diameter—at the bearing area on the semiconductor substrate—of between 5nm and 50 nm, in particular between 10 nm and 20 nm.

9. The method as claimed in claim 1, wherein the quantum dot is produced with a triangular, hexagonal or round contour, in particular as viewed perpendicularly to the {111} face of the substrate.

10. A photon pair source for generating entangled photon pairs comprising at least one quantum dot, wherein the at least one quantum dot is deposited on a {111} crystal face of a semiconductor substrate, and wherein each of the at least one quantum dot is deposited on a planar surface of the {111} crystal face.

11. The photon pair source as claimed in claim 10, wherein the ratio between the height of the quantum dot and the diameter of the quantum dot—at the bearing area on the {111} crystal face of the semiconductor substrate—is between 0.05 and 0.7, in particular between 0.15 and 0.5.

12. The photon pair source as claimed in claim 10, wherein the at least one quantum dot and/or the semiconductor substrate consists of a mixed crystal comprising:

In(Ga)As material incorporated into a Ga(In,Al)As crystal, and/or

In(Ga)P material incorporated into a Ga(In,Al)P crystal, and/or

In(Ga)As material incorporated into an In(Ga,Al)P crystal, and/or $In_xGa_{1-x}As$ material, where x is between 0.3 and 1.

13. The photon pair source as claimed in claim 10, wherein the diameter of the quantum dot —at the bearing area on the {111} crystal face of the semiconductor substrate—is between 5 nm and 50 nm, in particular between 10 nm and 20 nm.

14. The photon pair source as claimed in claim 10, wherein the quantum dot has a triangular, hexagonal or round contour, in particular as viewed perpendicularly to the {111} face of the semiconductor substrate.

15. The method as claimed in claim 1, wherein the fine structure splitting is zero.

16. The photon pair source as claimed in claim 10, wherein each of the at least one quantum dot includes at least a three-fold axis of symmetry and wherein fine structure splitting of the at least one quantum dot is close to zero.

17. The method as claimed in claim 1, wherein the at least one quantum dot is deposited on a planar surface of the {111} crystal face.

18. A photon pair source for generating entangled photon pairs comprising at least one quantum dot, wherein the at least one quantum dot is deposited on a {111} crystal face of a semiconductor substrate, wherein each of the at least one quantum dot includes at least a three-fold axis of symmetry, and wherein fine structure splitting of the at least one quantum dot is close to zero.

19. A method for producing a photon pair source, which generates entangled photon pairs, comprising at least one quantum dot, wherein, in the method, the operational behavior of the photon pair source is defined by setting the fine structure splitting of the excitonic energy level of the at least one quantum dot, wherein the fine structure splitting of the excitonic energy level is set by the at least one quantum dot being deposited on a {111} crystal face of a semiconductor substrate, and wherein each of the at least one quantum dot is deposited on a planar surface of the {111} crystal face.

20. The photon pair source as claimed in claim 18, wherein the fine structure splitting is zero.

* * * * *